United States Patent
Hsieh et al.

(10) Patent No.: US 8,659,869 B2
(45) Date of Patent: Feb. 25, 2014

(54) METHOD FOR FORMING RUTILE TITANIUM OXIDE AND THE STACKING STRUCTURE THEREOF

(75) Inventors: Chun I Hsieh, Taoyuan (TW); Vishwanath Bhat, Boise, ID (US); Jennifer Sigman, Boise, ID (US); Vassil Antonov, Boise, ID (US); Wei Hui Hsu, Zhongli (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 100 days.

(21) Appl. No.: 13/348,761

(22) Filed: Jan. 12, 2012

(65) Prior Publication Data

US 2013/0182367 A1    Jul. 18, 2013

(51) Int. Cl.
*H01G 4/30*    (2006.01)
(52) U.S. Cl.
USPC ........................................... 361/301.4

(58) Field of Classification Search
USPC ........... 361/301.4, 301.2, 303–305, 311–313, 361/321.1, 306.1, 306.3
See application file for complete search history.

(56) References Cited

U.S. PATENT DOCUMENTS

| | | | | |
|---|---|---|---|---|
| 6,844,260 B2 * | 1/2005 | Sarigiannis et al. | ......... | 438/680 |
| 6,952,032 B2 * | 10/2005 | Forbes et al. | ................. | 257/314 |
| 7,081,421 B2 * | 7/2006 | Ahn et al. | ...................... | 438/785 |
| 7,084,482 B2 * | 8/2006 | Lee et al. | ...................... | 257/532 |
| 7,482,242 B2 * | 1/2009 | Park et al. | ...................... | 438/396 |
| 7,936,555 B2 * | 5/2011 | Lin et al. | ...................... | 361/502 |

* cited by examiner

*Primary Examiner* — Nguyen T Ha
(74) *Attorney, Agent, or Firm* — Stites & Harbison PLLC; Juan Carlos A. Marquez, Esq.

(57) ABSTRACT

A method for forming a stacking structure, including forming a ruthenium oxide layer over a substrate; forming a praseodymium oxide layer over the ruthenium oxide layer; and forming a titanium oxide layer over the praseodymium oxide layer; wherein the titanium oxide layer has a rutile phase with the existence of the praseodymium oxide layer underneath. The oxide layers are deposited by a plurality of atomic layer deposition cycles using ruthenium precursor, praseodymium precursor, titanium precursor, and ozone.

18 Claims, 15 Drawing Sheets

METHOD FOR FORMING RUTILE TITANIUM OXIDE AND THE STACKING STRUCTURE THEREOF

BACKGROUND OF THE INVENTION

1. Technical Field

The present invention relates to a method for forming a stacking structure, and more particularly, to a method for forming a stacking structure having a rutile phase titanium oxide by forming a praseodymium oxide interface layer prior to the titanium oxide crystal growth.

2. Background

The performance of complementary metal-oxide-semiconductor (CMOS) devices has continued to improve over four decades in accordance with the prediction of Moore's Law of scaling. As the number of devices on an integrated circuit has increased exponentially, the minimum feature size in a transistor has decreased exponentially each year. Dynamic random access memory (DRAM) is another common device which constitutes memory cells, each having a capacitor that hold a charge indicative of a data value in the memory cell. One of the common features of the two devices mentioned above is a generic metal-insulator-metal (MIM) structure. Keeping pace with the rapid reduction of the size of devices, the thickness of the insulator layer, typically silicon dioxide, has decreased to under 2 nm. At this level of thickness, a substantial leakage current occurs due to direct tunneling of the electrons through the insulator layer. A solution in this field is to find an alternative material which can provide a greater thickness to prevent the tunneling form happening and at the same time, possessing a higher relative permittivity, or dielectric constant, to maintain a required capacitance. The relation of the capacitance to the thickness and dielectric constant can be described in the following equation:

$$C = \epsilon_0 \epsilon_r A/t,$$

where C is capacitance, $\epsilon_0$ is vacuum permittivity, $\epsilon_r$ is relative permittivity or dielectric constant, A is the area of the metal-insulator interface, and t is the thickness of the insulator. In light of the equation, maintaining $\epsilon_r$ and t at a predetermined ratio is necessary to discover an effective production method of a high dielectric constant material with a sufficient thickness. In other words, a material with inherently low leakage current and a dielectric constant high enough to maintain a consistent ratio of ($\epsilon_r$/t) turns out to be an ideal target in solving this aspect of the microelectronic scaling problem.

Node dielectrics for beyond 3×nm DRAM require a dielectric constant over 70, which makes titanium dioxide ($TiO_2$) an ideal candidate for this purpose. $TiO_2$ occurs in nature as three well-known phases—rutile, anatase, and brooktie, wherein the rutile phase $TiO_2$ is reported to have a dielectric constant of between 90 and 170, depending on formation conditions. However, current industrial production methods use atomic layer deposition (ALD) to produce $TiO_2$, while ALD $TiO_2$ inherently forms anatase phase, which is a low dielectric constant alternative, unless formation is performed using a template substrate, doping, high temperature ALD, or post deposition annealing at temperatures greater than 600 degrees Celsius.

The method of using template substrate to form rutile phase $TiO_2$ suffers from several drawbacks, for example, in FIG. 1, an ALD process using $TiCl_4$ as Ti precursor and $H_2O$ as an oxidant over a template substrate requires a thickness of at least 10 nm for the rutile phase $TiO_2$ to be visible in a grazing angle X-ray diffraction. In addition to the large minimum thickness, a high processing temperature, as shown in FIG. 2, is required during production. FIG. 2 is a grazing angle X-ray diffraction showing different $TiO_2$ layers with various thicknesses and processing temperatures. It can be seen that production conditions of 70 angstrom and 450 degrees Celsius create a prominent rutile phase $TiO_2$ peak of around 27.5 two theta. A high processing temperature causes the rutile phase to form with a rough morphology, creating an inferior structure in terms of material density with increased leakage current. In addition, an ALD process using $TiCl_4$ as Ti precursor and $O_3$ as an oxidant over a template substrate not only delivers a low deposition rate but also incurs a risk of oxidizing or etching the under layer. For example, ruthenium contamination occurs in rutile phase $TiO_2$ due to the existence of an underlying ruthenium/ruthenium oxide layer.

Other methods like doping and post deposition annealing also create disadvantages in terms of microelectronic processing. For instance, doping silicon or zirconium during the ALD formation of $TiO_2$ is hard to control, and suffers from low throughput and high cost, while additional thermal treatment to the CMOS device can add mechanical stress to the entire underlying structure.

There is a need by the industry for a new formation method other than a template substrate, doping, or excessive annealing process that allows a thin rutile phase $TiO_2$ with high quality crystallinity to be formed. In response to such need, the present disclosure seeks to demonstrate a special structure for rutile phase $TiO_2$ formation.

SUMMARY

One aspect of the present invention is to disclose a stacking structure, comprising a substrate; a first oxide layer disposed on the substrate; a second oxide layer comprising praseodymium oxide and disposed on the first oxide layer; and a third oxide layer comprising titanium oxide and disposed on the second oxide layer.

Another aspect of the present invention is to disclose a method of forming a stacking structure with a rutile phase titanium oxide as a top layer. The method comprises the following steps: forming a ruthenium oxide layer over a substrate; forming a praseodymium oxide layer over the ruthenium oxide layer; and forming a titanium oxide layer over the praseodymium oxide layer; wherein the titanium oxide layer has a rutile phase with the praseodymium oxide layer underneath.

Another aspect of the present invention is to disclose a method of forming a capacitor comprising a rutile phase titanium oxide. The method comprises the following steps: forming a ruthenium oxide layer on a bottom electrode; forming a praseodymium oxide layer on top of the ruthenium oxide layer; forming a titanium oxide layer on top of the praseodymium oxide layer; and forming a top electrode on the titanium oxide layer, wherein the titanium oxide layer has a rutile phase with the existence of the praseodymium oxide layer.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated by the following description and upon reference to the accompanying drawings in which.

DETAILED DESCRIPTION

Figure 1:
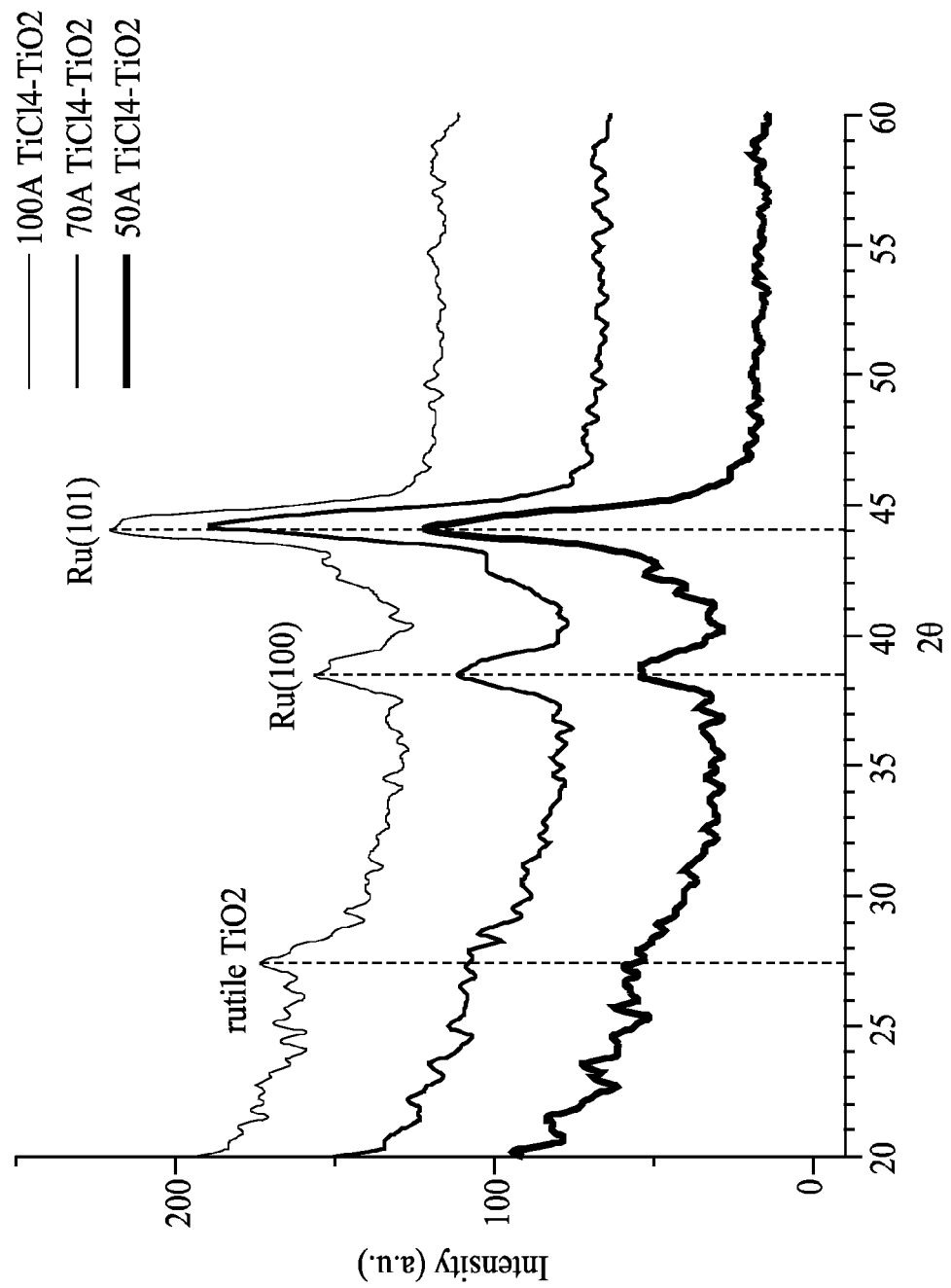
FIG. 1 is a graph of the grazing angle of X-ray diffraction (XRD) showing a characteristic of a rutile phase titanium oxide under different film thicknesses.
Figure 2:
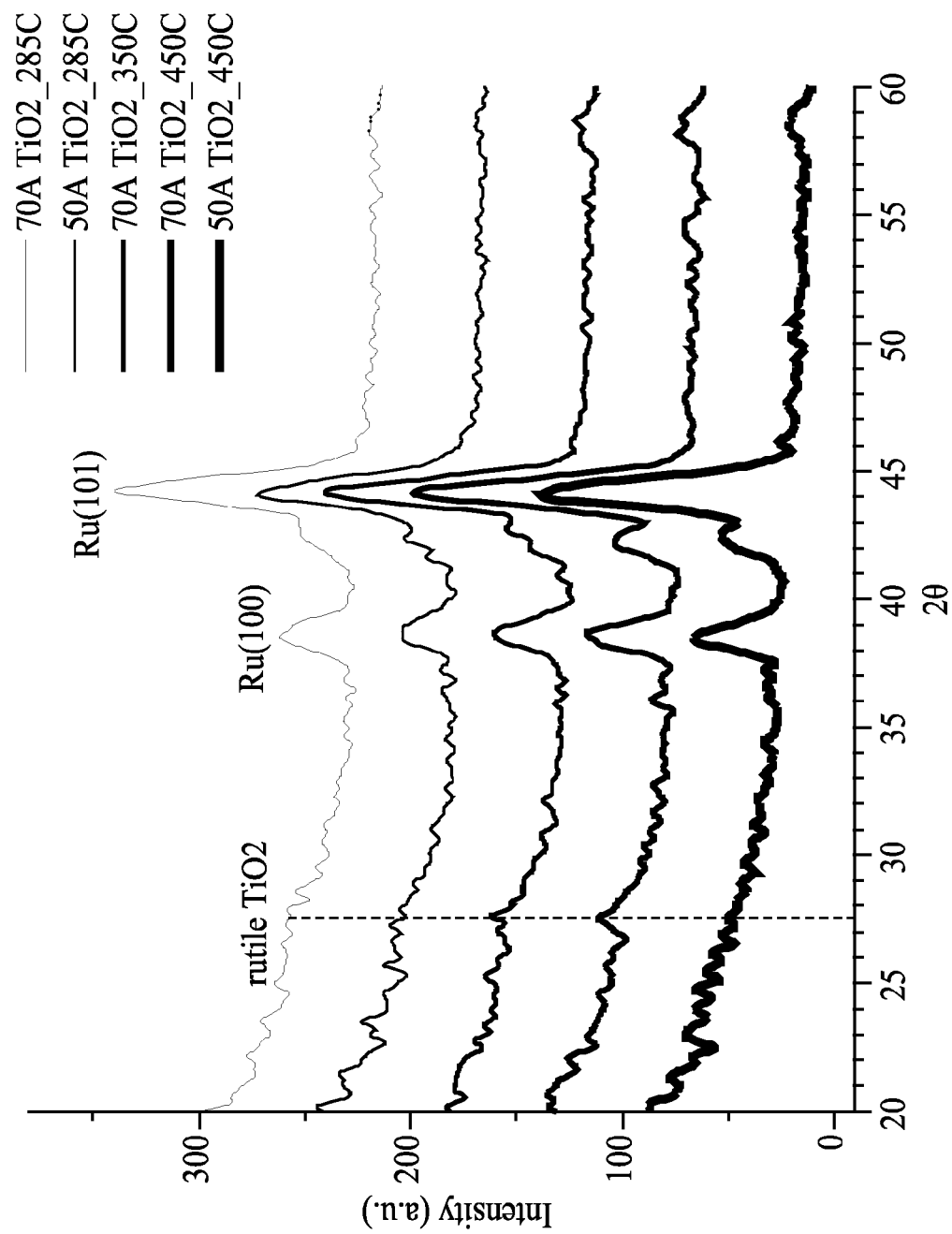
FIG. 2 is a graph of the grazing angle of XRD showing a characteristic of a rutile phase titanium oxide under different film thicknesses and processing temperatures.
Figure 3:
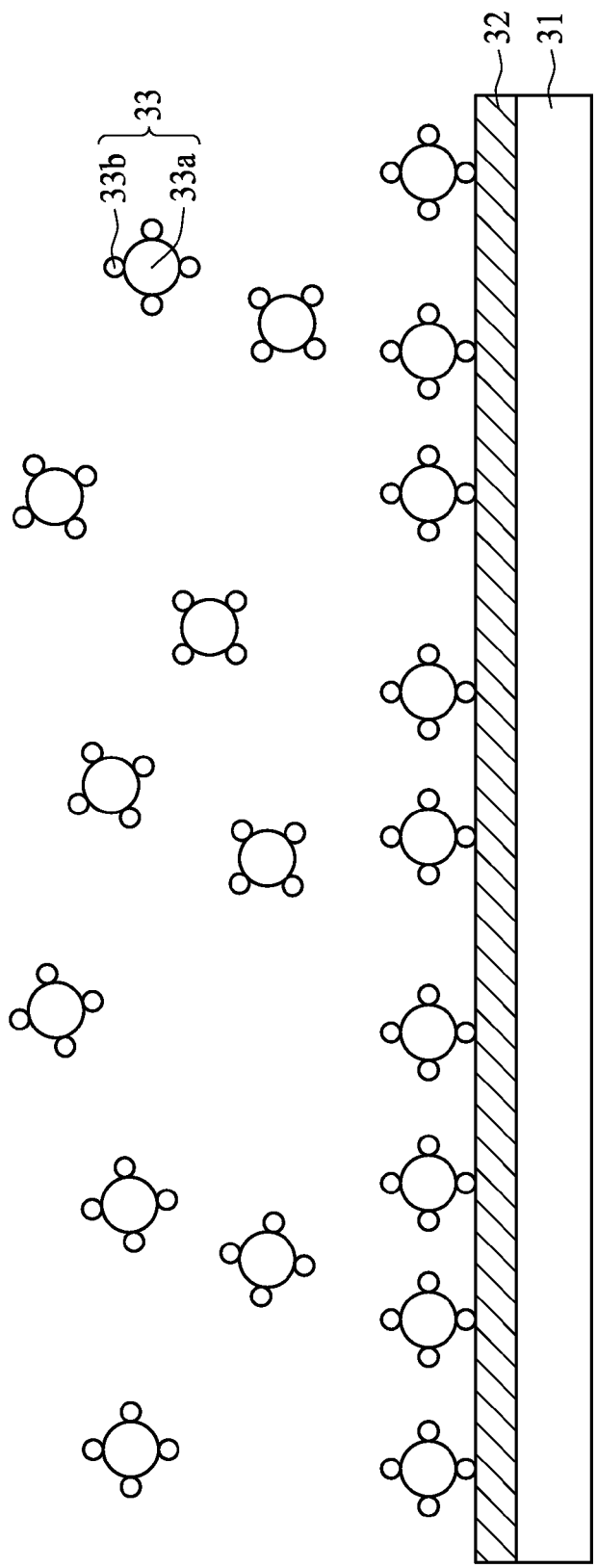
FIGS. 3 to 6 illustrate a cycle in an atomic layer deposition (ALD), including the following steps: introduction and chemisorption of the first precursor; a first purge of the unreacted first precursor; introduction and chemisorption of the second precursor; and a second purge of the unreacted second precursor and the reaction byproduct.
Figure 4:
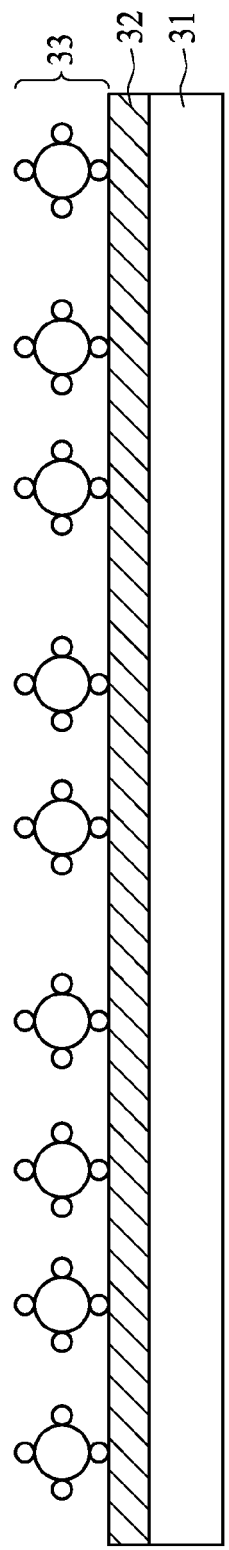
Figure 5:
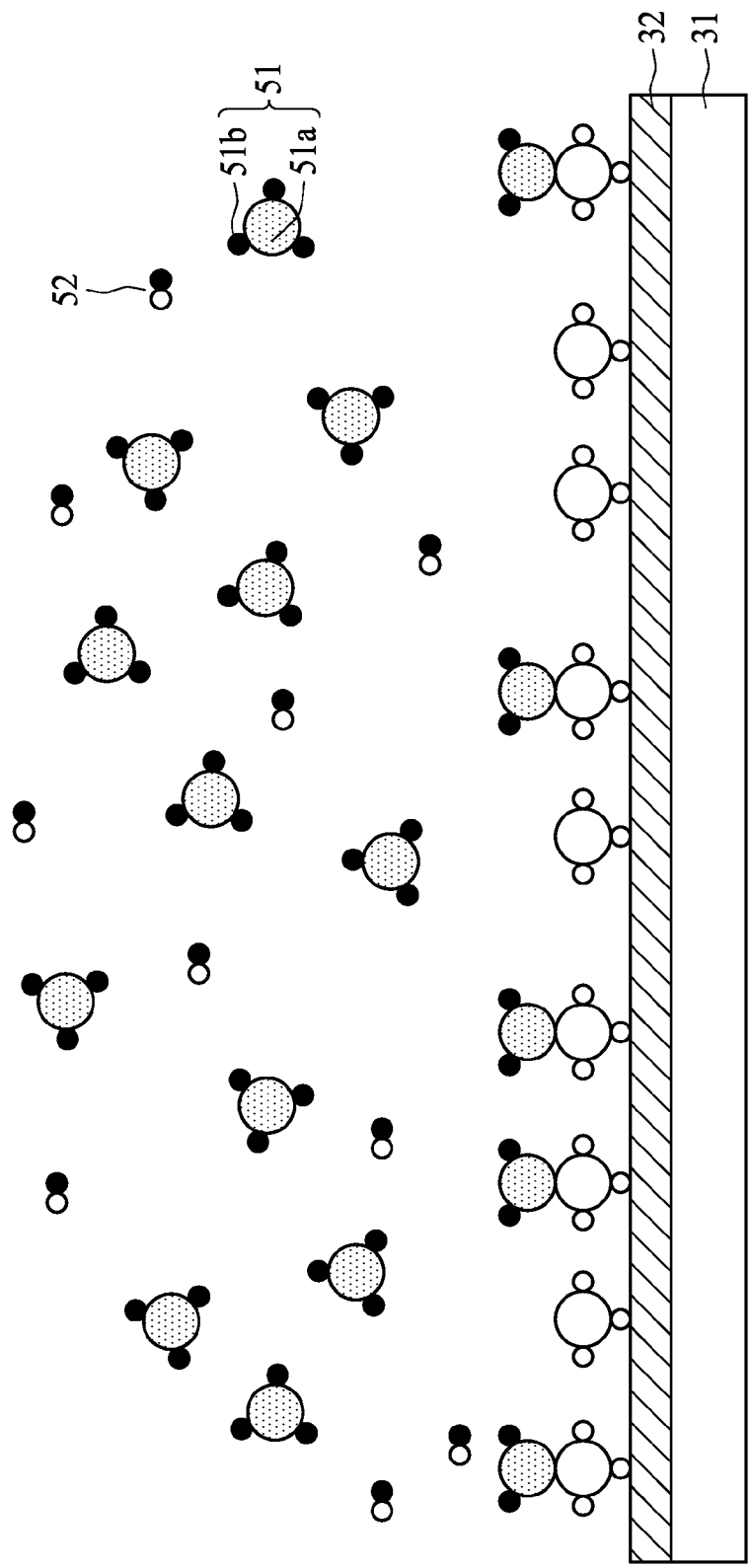
Figure 6:
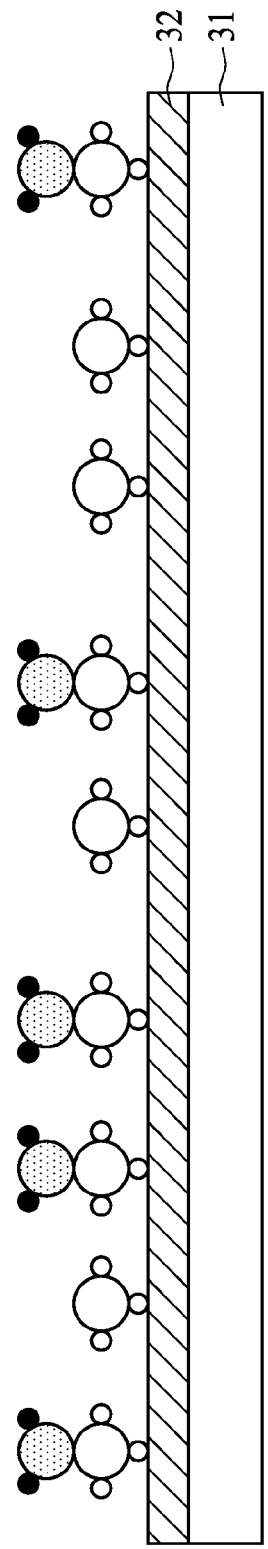

The present disclosure builds on existing knowledge of atomic layer deposition (ALD) process, which has been identified as an important thin film growth technique for microelectronics manufacturing. Current ALD process relies on sequential, saturating surface reactions of alternately applied precursors, separated by inert gas purging. The surface-controlled nature of ALD enables the growth of thin films of high conformity and uniformity with accurate thickness control. FIGS. 3 to 6 illustrate a cycle in an atomic layer deposition, including the following steps: in FIG. 3, a substrate 31 is functionalized with a layer of absorption sites 32, for example, a layer of hydroxyl sites obtained from exposure of the substrate to water vapor (note, however, that different precursors require different kinds of absorption sites); and introduction and chemisorption of the precursor 33, wherein the first precursor 33 includes a body 33a and several reaction sites 33b which are used to chemisorb to the absorption sites and react with a second precursor introduced in a latter step. FIG. 4 illustrates a first purge of the excessive and unabsorbed first precursor 33 using inert gas. FIG. 5 illustrates an introduction of the second precursor 51 having a body 51a and several reaction sites 51b which are used to react with the reaction sites 33b of the first precursor 33. The reaction between the first precursor 33 and the second precursor 51 also generates byproducts 52 that fill the reaction chamber. FIG. 6 illustrates a second purge of the excessive and unabsorbed second precursor 51 and byproducts 52 using inert gas. Each cycle of the ALD process portrayed in FIGS. 3 to 6 forms a single monolayer of material. A plurality of cycles can be performed in order to produce a continuous film of the desired thickness and materials.

Figure 7:
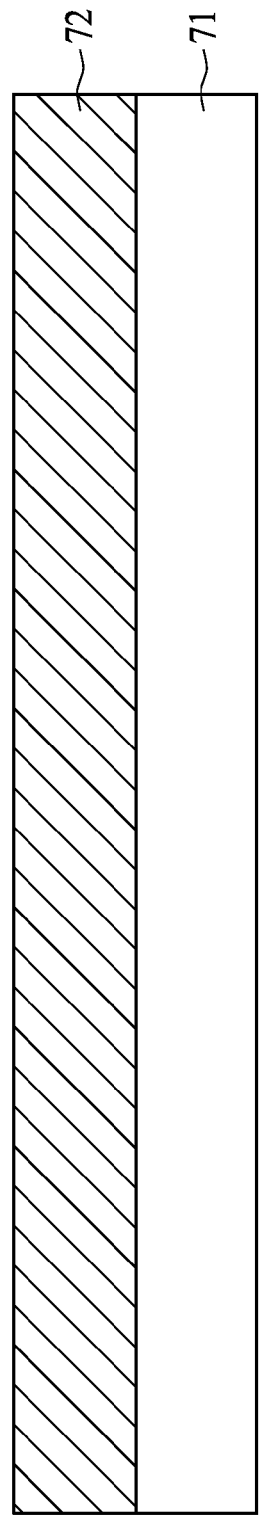
FIGS. 7 to 9 are cross-sectional views illustrating the stacking process of the oxide layers.
Figure 8:
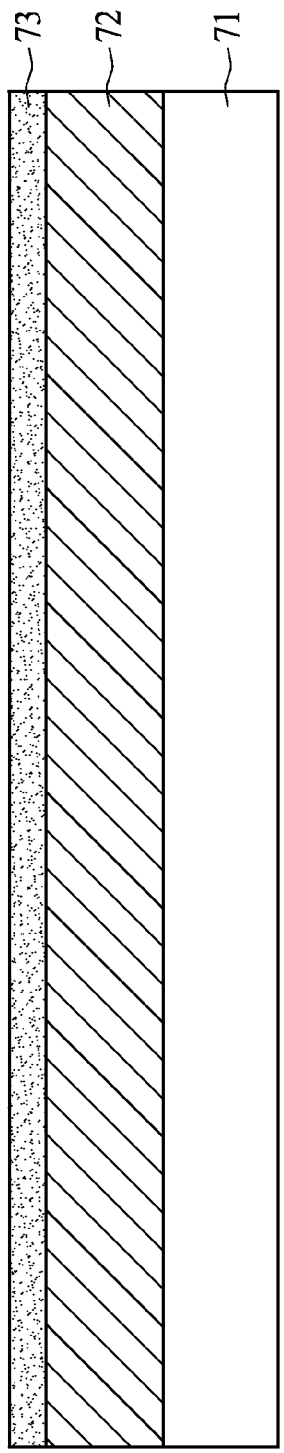
Figure 9:
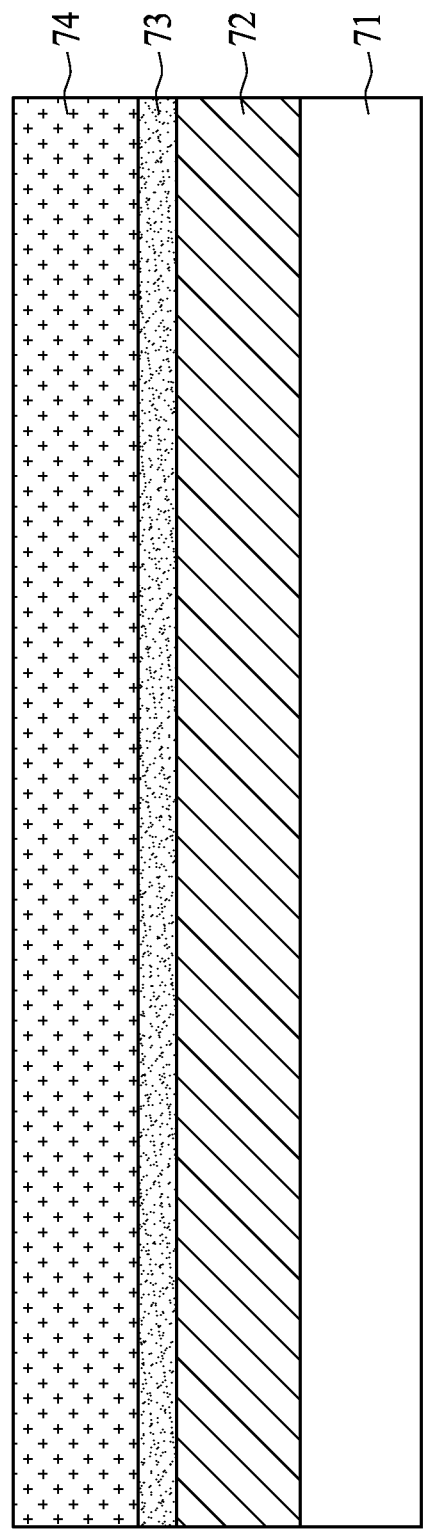

FIGS. 7 to 9 are cross-sectional views illustrating the stacking layer which generates a rutile phase $TiO_2$ on top of the structure. In FIG. 7, a substrate 71 is provided with a first oxide layer 72 deposited on top. In one embodiment of the present invention, the substrate 71 can be selected from the group consisting of RuSi, Ti, TiSi, TiN, or TaN, while the first oxide layer 72 comprises ruthenium (Ru) and ruthenium oxide ($RuO_x$). The Ru/$RuO_x$ layer is deposited by an ALD process followed by an oxidation step, and has a thickness preferably between 4 to 10 nm. FIG. 8 shows a second oxide layer 73 deposited on top of the first oxide layer 72. In one embodiment of the present invention, an ALD is carried out to form the second oxide layer 73, in this case praseodymium oxide, using praseodymium precursor $Pr(Cp)_3$ and using an ozone as an oxidant in a sequential manner.

Referring back to FIG. 3 to FIG. 6, in one embodiment of the present invention, a chamber pressure of 1-5 ton is established and a substrate temperature of 240-300 degrees Celsius is maintained. Praseodymium precursor $Pr(Cp)_3$ acts as the first precursor 33 in FIG. 3, which is introduced into the chamber and chemisorbed onto the absorption sites 32 on the substrate 31. An inert gas purge step, shown in FIG. 4, is performed, with a purge duration of greater than 10 seconds. The oxidant in such ALD process is ozone, which is analogous to the second precursor 51 shown in FIG. 5. A second purge step is carried out to remove the excessive or unabsorbed ozone with a purge duration of greater than 10 seconds. In FIG. 6, a monolayer of praseodymium oxide is formed after a complete cycle; in the present embodiment, at least five cycles were carried out to form the praseodymium oxide layer having a thickness in a range of 0.1 nm to 1 nm. Because five monolayers cannot generate a sufficiently strong and narrow a constructive interference pattern which manifests as a diffraction peak on the grazing angle X-ray diffraction diagram, the formation of the praseodymium oxide in the present invention can only be determined by a composition analysis such as electron energy loss spectroscopy (EELS).

In another embodiment of the present invention, during the formation of the praseodymium oxide, an optional oxidation step can be performed on the praseodymium precursor using gases comprising oxygen. In this embodiment, a layer-by-layer fashion is no longer adopted, in contrast, in situ oxidation of the praseodymium precursor is carried out to form praseodymium oxide.

FIG. 9 shows a third oxide layer 74 deposited on top of the second oxide layer 73. In one embodiment of the present invention, an ALD is carried out to form the third oxide layer 74, in this case titanium oxide, using titanium precursor comprising titanium tetrachloride ($TiCl_4$), titanium isopropoxide (TTIP), $CH_3C_5H_4Ti(N(CH_3)_2)_3$ (TIMCTA), and ozone as an oxidant in a sequential manner.

Referring back to FIGS. 3 to 6, in one embodiment of the present invention, a chamber pressure of 1-5 ton is established, and a substrate temperature of 150-500 degrees Celsius is maintained. One of the $TiCl_4$, TTIP, and TIMCTA acts as the first precursor 33 in FIG. 3, which is introduced into the chamber and chemisorbed onto the absorption sites 32 on the substrate 31. An inert gas purge step, shown in FIG. 4, is performed with a purge duration of greater than 10 seconds. The oxidant in such ALD process is ozone, occupying 10-20% by volume, which is analogous to the second precursor 51 shown in FIG. 5. A second purge step is carried out to remove the excessive or unabsorbed ozone, with a purge duration of greater than 10 seconds. In FIG. 6, a monolayer of titanium oxide is formed after a complete cycle. In the present embodiment, at least sixty cycles were carried out to form the praseodymium oxide having a thickness of at least 5 nm. In terms of industrial usability, a dielectric layer with a high crystal quality and a thickness of greater than 5 nm can effectively prevent electron tunneling, and therefore a lower leakage current is provided.

Figure 11:
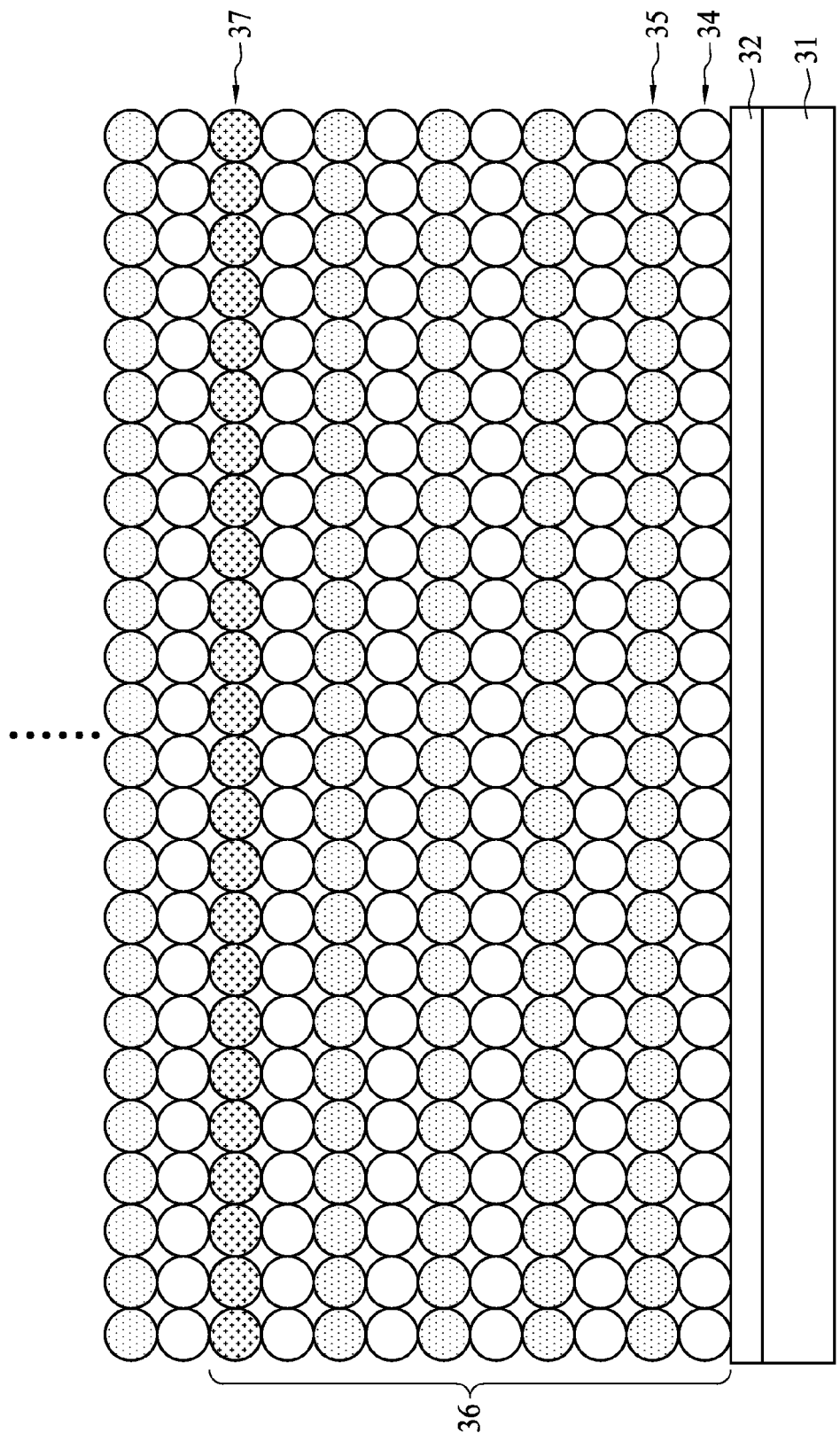
FIG. 11 is a conceptual illustration of a doping layer in the ALD process.

In another embodiment of the present invention, during the ALD process of the titanium oxide, an optional digital doping step can be introduced in a fashion with a 20-to-1 monolayer ratio. Digital doping, frequently adopted as a means of adding dopants among the course of an epitaxy, is explained in the illustration shown in FIG. 11. A substrate 31 functionalized by functional groups to form absorption sites 32 is provided in an ALD process. The first precursor reacts with the second precursor to form a monolayer containing the body of the first precursor 34 and the body of the second precursor 35 after a complete cycle. In FIG. 11, after 4 complete cycles, i.e., four monolayers, a special cycle is incurred to introduce dopant precursor into the ALD chamber. The body of the dopant precursor 37, along with the previously deposited 4 monolayers, exhibits a super periodic structure 36 having five monolayers. In the present embodiment, 20 monolayers of rutile phase $TiO_2$ are pre-deposited followed by 1 monolayer of dopant deposition to accomplish a 20-to-1 monolayer ratio digital doping. The dopant precursor used in the present embodiment is trimethylaluminum (TMA).

Figure 10:
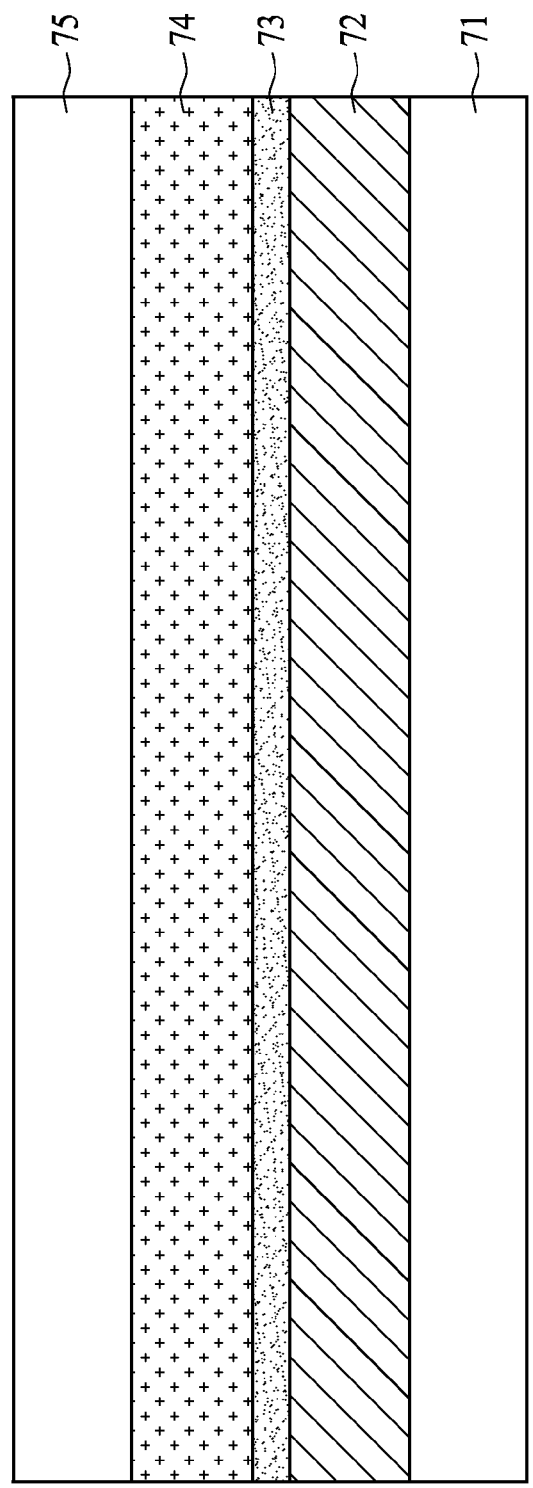
FIG. 10 is a cross-sectional view illustrating the stacking structure of a capacitor.

The stacking structure disclosed above can be further fabricated into a capacitor, i.e. an M-I-M structure. As shown in FIG. 10, all the steps are followed from the above disclosure until the formation of the rutile phase $TiO_2$. To form a capacitor, a top electrode 75 is further deposited onto the rutile phase $TiO_2$. In one embodiment of the present invention, the top electrode 75 is preferably sputtered with the material identical to the substrate, for example, RuSi, Ti, TiSi, TiN, or TaN.

Figure 12:
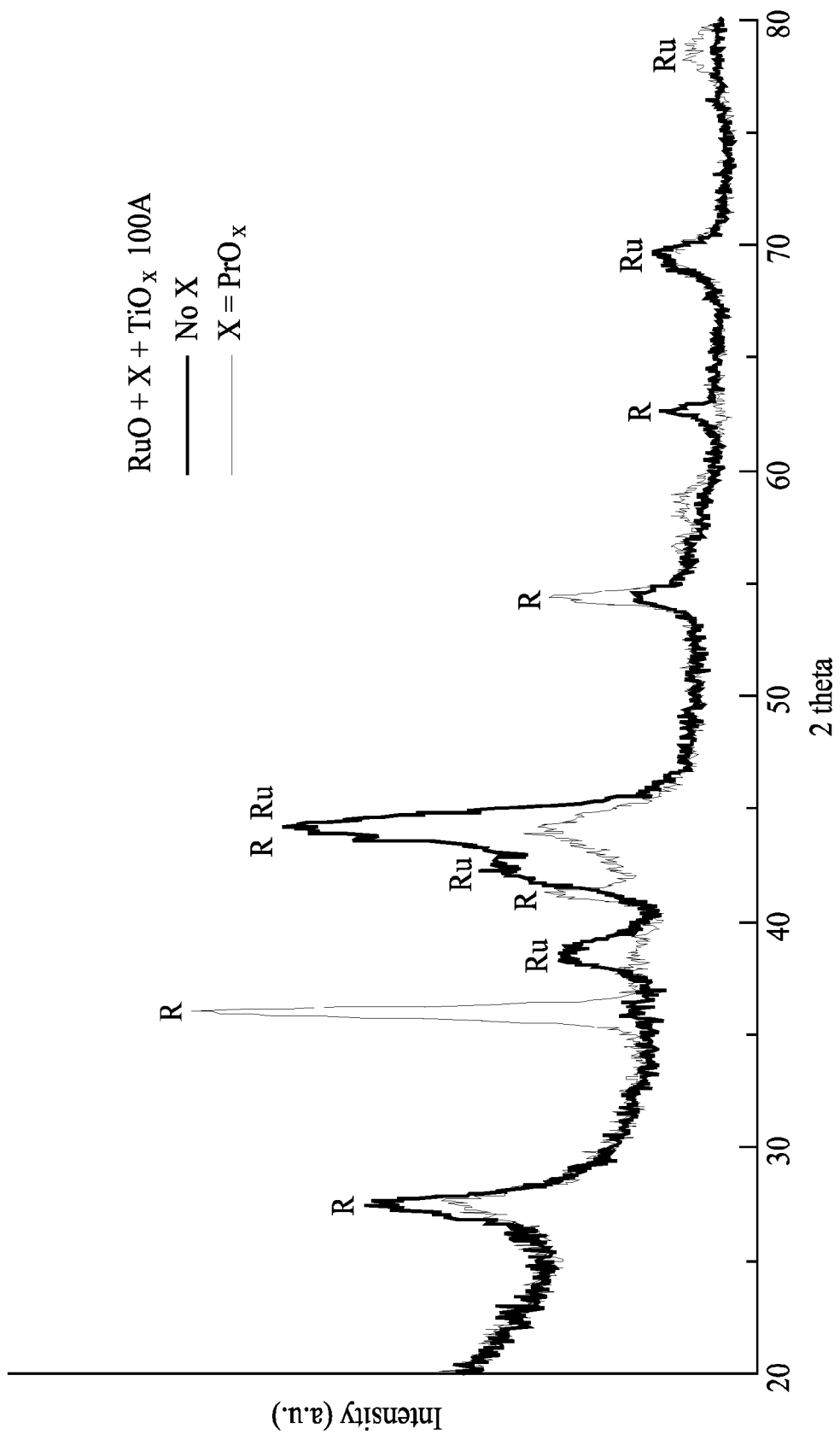
FIG. 12 is a graph of the grazing angle of XRD showing characteristics of a rutile phase titanium oxide under two stacking conditions: 1) with a praseodymium oxide layer underneath the titanium oxide layer; and 2) without a praseodymium oxide layer underneath the titanium oxide layer.

FIG. 12 shows a grazing angle XRD characterizing the existence of a rutile phase titanium oxide under two stacking conditions: 1) with praseodymium oxide layer underneath the titanium oxide layer, and 2) without praseodymium oxide layer underneath the titanium oxide layer. The thicker line indicates the diffraction pattern of the former condition, and the thinner line indicates the diffraction pattern of the latter. Peaks labeled with Ru which are situated at 27, 38, 43, 45, 54, 69, and 78 two theta characterize the existence of the ruthenium in the stacking structure, while peaks labeled with R which are situated at 27, 36, 42, 44, 54, 63, and 69 two theta characterize the existence of the rutile phase titanium oxide. As mentioned above, praseodymium oxide layer is not visible in the diffraction pattern due to the lack of constructive interference.

Figure 13:
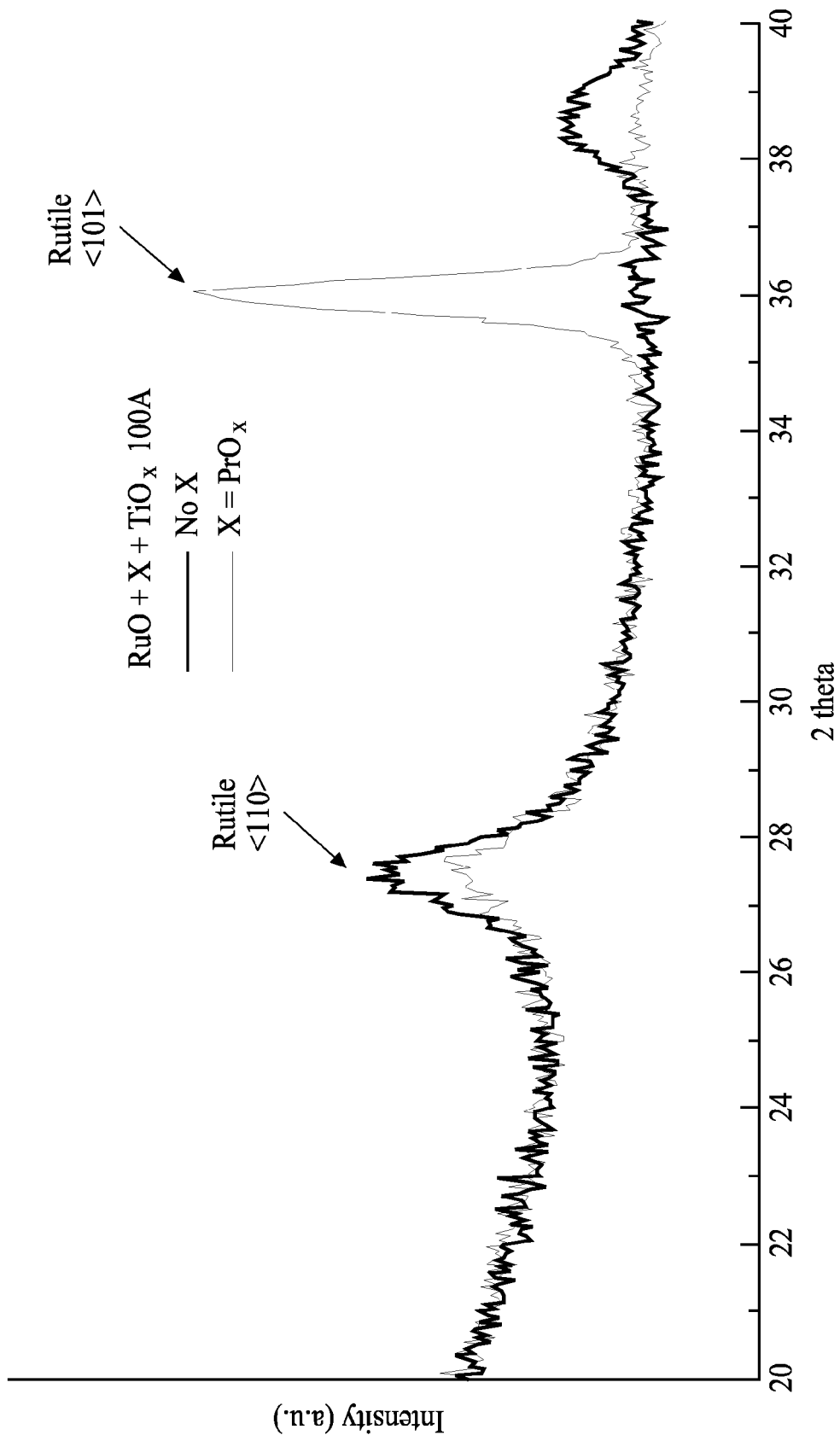
FIG. 13 is an enlargement of the graph of FIG. 11 showing the grazing angle of XRD from 20 to 40 degrees.

FIG. 13 is an enlarged grazing angle XRD from 20 to 40 degree two theta in FIG. 12. Since the only difference in the two conditions above is the existence of a thin praseodymium oxide layer, we can conclude from this experimental data that the titanium oxide deposited on the stacking structure containing a praseodymium oxide layer consists essentially of rutile phase, while the titanium oxide deposited on the stacking structure containing no praseodymium oxide layer does not show any evidence of the existence of rutile phase.

Figure 14:
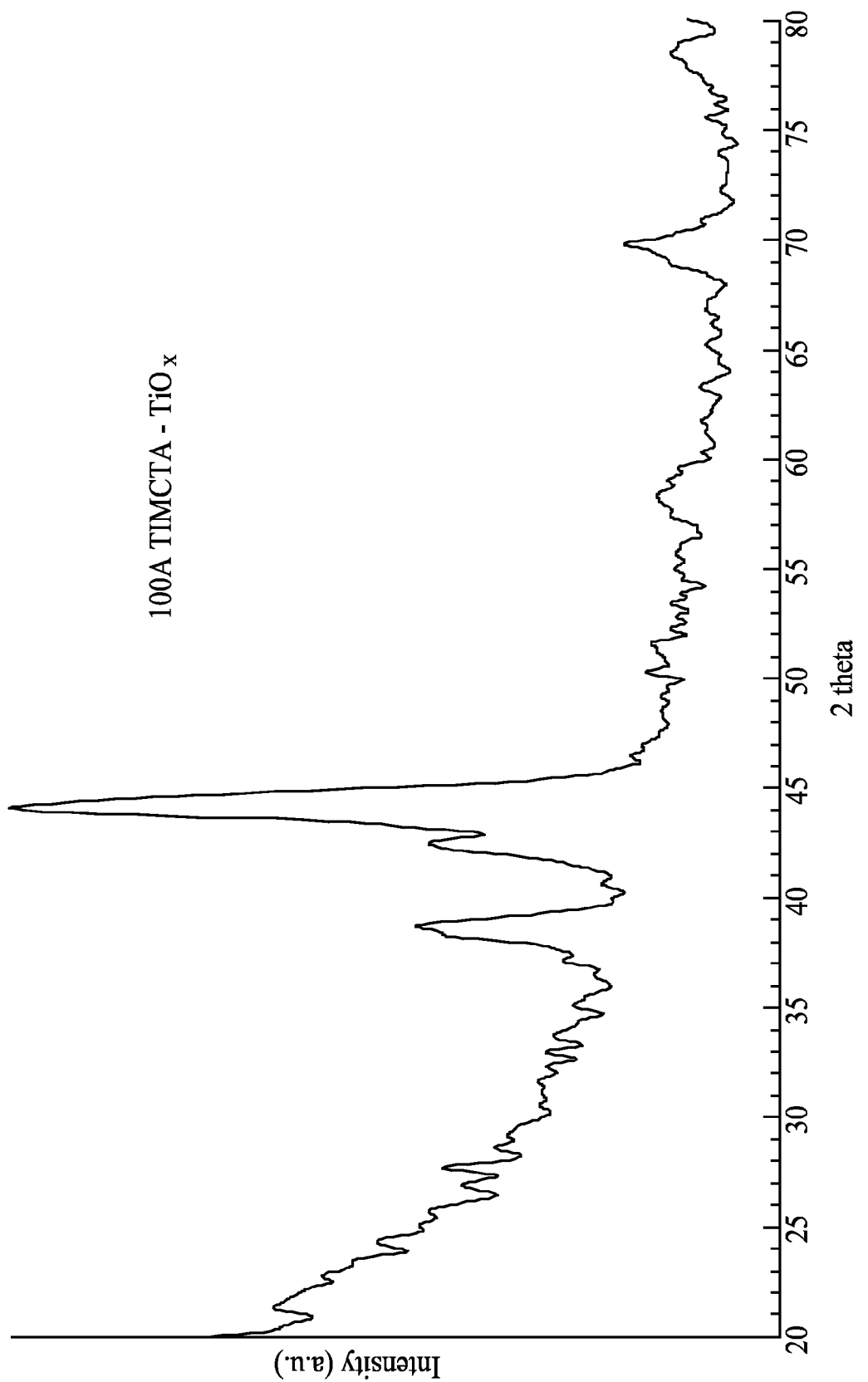
FIG. 14 is a graph of the grazing angle of XRD showing characteristics of an amorphous titanium oxide using TIMCTA as a titanium precursor.
Figure 15:
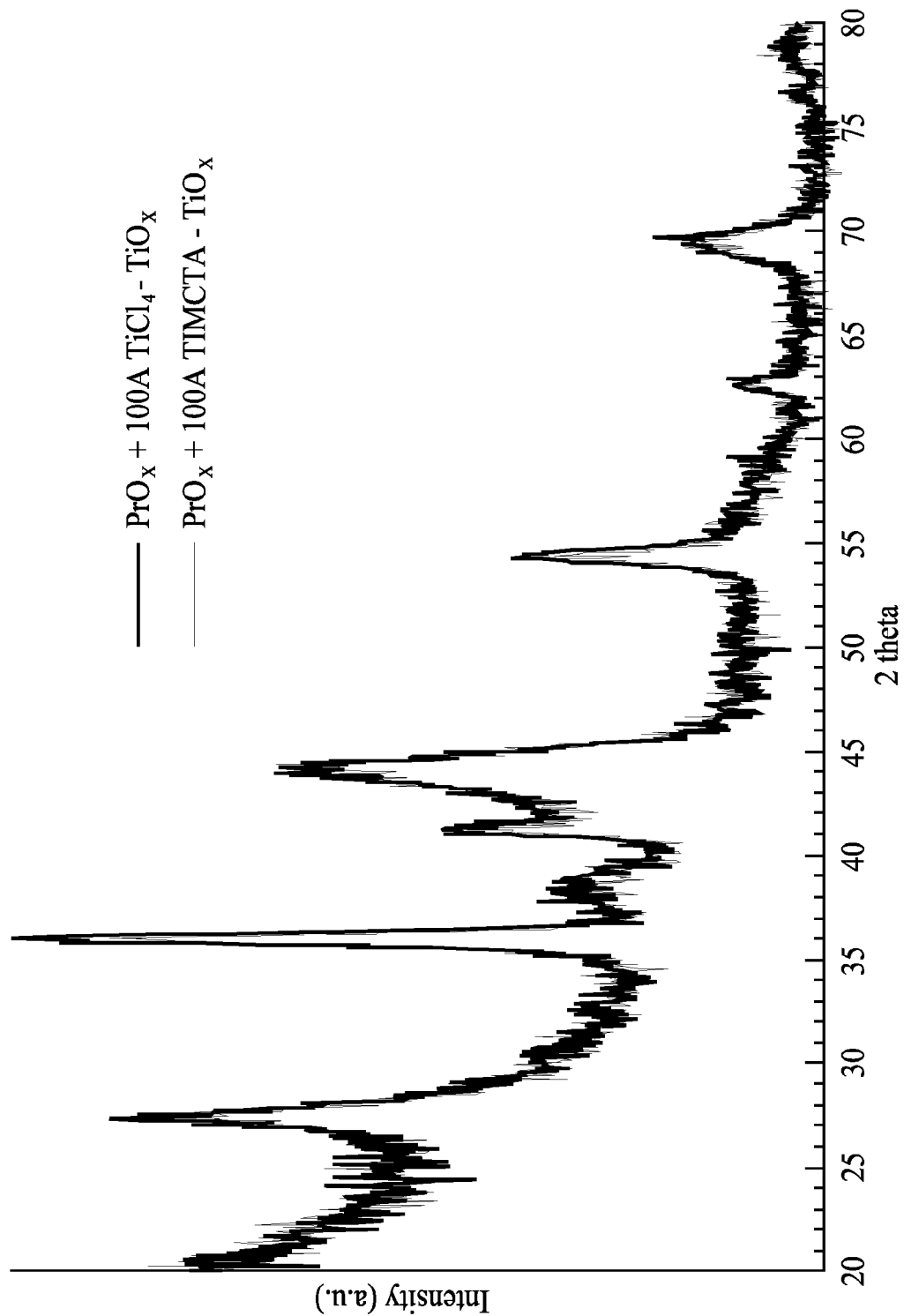
FIG. 15 is a graph of the grazing angle of XRD showing characteristics of a rutile phase titanium oxide formed by two titanium precursors, $TiCl_4$ and TIMCTA, both with a praseodymium oxide layer underneath the titanium oxide layer.

FIG. 14 is a grazing angle XRD diagram of an amorphous titanium oxide using TIMCTA as a titanium precursor. As shown in FIG. 14, the peaks situated around 38 and 45 two theta account for the existence of the ruthenium since the titanium oxide using TIMCTA as a titanium precursor is known to be amorphous. FIG. 15 is a grazing angle XRD diagram characterizing the existence of a rutile phase titanium oxide formed by two titanium precursors: 1) $TiCl_4$ and 2) TIMCTA, both with a praseodymium oxide layer underneath the titanium oxide layer. The titanium oxide using $TiCl_4$ as a titanium precursor is known to be crystalline, and the two deposition conditions show an identical diffraction pattern. FIG. 15 demonstrates that the rutile phase $TiO_2$ exists whether using $TiCl_4$ or TIMCTA as a titanium precursor. From comparing FIG. 15 to FIG. 14, it is evident that several peaks representing the rutile phase $TiO_2$ appear in FIG. 15 but not in FIG. 14. Hence, FIG. 15 concludes that the existence of a praseodymium oxide layer underneath is a key measure to obtain rutile phase $TiO_2$ regardless of the titanium precursor used in the subsequent ALD process.

Summing up, the present invention discloses a stacking structure which leads to the formation of a rutile phase titanium oxide layer primarily via an ALD process. A pre-deposited praseodymium oxide layer is positioned directly underneath the titanium oxide layer to ensure rutile phase titanium oxide is formed in the subsequent titanium oxide deposition process. The thickness and the detailed formation process of the praseodymium oxide layer are disclosed in the present invention, and the X-ray diffraction patterns are used to support the formation of the rutile phase titanium oxide using the present measure.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. A stacking structure, comprising:
   a substrate;
   a first oxide layer stacking on the substrate;
   a second oxide layer comprising praseodymium oxide, stacking on the first oxide layer; and
   a third oxide layer comprising titanium oxide, stacking on the second oxide layer, wherein the titanium oxide layer has a rutile phase with the existence of praseodymium oxide underneath.

2. The stacking structure of claim 1, wherein the titanium oxide has a rutile phase.

3. The stacking structure of claim 1, wherein the first oxide layer comprises ruthenium and ruthenium oxide.

4. The stacking structure of claim 1, wherein the second oxide layer has a thickness of between 0.1 nm and 1.0 nm.

5. The stacking structure of claim 1, wherein the substrate serves as a bottom electrode of a capacitor and comprises RuSi, Ti, TiSi, TiN, or TaN.

6. The stacking structure of claim 5, further comprising a top layer positioned on the third oxide layer, wherein the top layer serves as a top electrode of the capacitor and comprises RuSi, Ti, TiSi, TiN, or TaN.

7. A method for forming a stacking structure, comprising the following steps:
forming a ruthenium oxide layer over a substrate;
forming a praseodymium oxide layer over the ruthenium oxide layer; and
forming a titanium oxide layer over the praseodymium oxide layer; wherein the titanium oxide layer has a rutile phase with the existence of the praseodymium oxide layer underneath.

8. The method for forming a stacking structure of claim 7, wherein the substrate comprises RuSi, Ti, TiSi, TiN, or TaN.

9. The method for forming a stacking structure of claim 7, wherein the ruthenium oxide layer comprises a thickness of from 4 nm to 10 nm.

10. The method for forming a stacking structure of claim 7, wherein the forming of the praseodymium oxide layer comprises:
performing at least 5 cycles of atomic layer deposition to form the praseodymium oxide layer having a thickness in a range of from 0.1 nm to 1.0 nm, using praseodymium precursor and oxidant in a sequential manner.

11. The method for forming a stacking structure of claim 10, wherein the praseodymium precursor comprises $Pr(Cp)_3$, and the oxidant comprises ozone.

12. The method for forming a stacking structure of claim 7, wherein the forming of the titanium oxide layer comprises:
performing a predetermined cycles of atomic layer deposition to form the titanium oxide layer having a thickness of at least 5 nm, using titanium precursor and oxidant in a sequential manner; and
wherein the temperature of the substrate is in a range of from 150 to 500 degrees Celsius during the atomic layer deposition.

13. The method for forming a stacking structure of claim 12, wherein the titanium precursor comprises $TiCl_4$, TTIP, TIMCTA, or the combination thereof, and the oxidant comprises ozone.

14. The method for forming a stacking structure of claim 12, wherein the forming of the titanium oxide layer further comprises a doping process using a titanium precursor, a dopant precursor, and an oxidant sequentially in the atomic layer deposition.

15. The method for forming a stacking structure of claim 14, wherein the titanium precursor comprises $TiCl_4$, TTIP, TIMCTA, or the combination thereof, the dopant precursor comprises TMA, and the oxidant comprises ozone.

16. The method for forming a stacking structure of claim 7, wherein the forming of the praseodymium oxide layer further comprises an oxidation treatment process using gases comprising oxygen.

17. The method for forming a stacking structure of claim 7, further comprising a step of forming a top layer on the titanium oxide layer, wherein the substrate serves as a bottom electrode, and the top layer serves as a top electrode.

18. The method for forming a stacking structure of claim 17, wherein the bottom electrode and the top electrode comprises RuSi, Ti, TiSi, TiN, or TaN.

* * * * *